(12) United States Patent
Sidwell

(10) Patent No.: US 7,683,474 B2
(45) Date of Patent: Mar. 23, 2010

(54) LED ASSEMBLY WITH LED POSITION TEMPLATE AND METHOD OF MAKING AN LED ASSEMBLY USING LED POSITION TEMPLATE

(75) Inventor: Steven C. Sidwell, Hopkinton, NH (US)

(73) Assignee: Osram Sylvania Inc., Danvers, MA (US)

( * ) Notice: Subject to any disclaimer, the term of this patent is extended or adjusted under 35 U.S.C. 154(b) by 934 days.

(21) Appl. No.: 11/058,310

(22) Filed: Feb. 14, 2005

(65) Prior Publication Data

US 2006/0181877 A1  Aug. 17, 2006

(51) Int. Cl.
*H01L 23/34* (2006.01)
(52) U.S. Cl. .................. 257/712; 257/675; 257/713; 257/796; 257/E33.075
(58) Field of Classification Search ............... 257/276, 257/625, 675, 706, 707, 712–722, 796
See application file for complete search history.

(56) References Cited

U.S. PATENT DOCUMENTS 6,296,376 B1 * 10/2001 Kondo et al. ............... 362/310
2002/0001192 A1 * 1/2002 Suehiro et al. ............. 362/240

* cited by examiner

*Primary Examiner*—Wai-Sing Louie
(74) *Attorney, Agent, or Firm*—William E. Meyer; Edward S. Podszus

(57) ABSTRACT

A light emitting diode (LED) assembly and a method of making the assembly, in which a container having an open top is provided with a two sets of holes through a bottom of the container, an electrically conductive heat sink is attached to the container bottom beneath the first set of holes, and in which an electrically conductive sheet is attached to the container bottom beneath the second set of holes, where the heat sink and sheet are isolated from each other. LEDs are placed in the first set of holes so that each has a first LED terminal on and adhered to an exposed part of the heat sink through the respective one of the first holes and in which a second LED terminal is connected via a wire lead to the sheet through a respective one of the second holes.

19 Claims, 3 Drawing Sheets

LED ASSEMBLY WITH LED POSITION TEMPLATE AND METHOD OF MAKING AN LED ASSEMBLY USING LED POSITION TEMPLATE

BACKGROUND OF THE INVENTION

1. Field of the Invention

The invention relates to electric light and particularly to electric light emitting diodes. More particularly the present invention is directed to an assembly that contains plural light emitting diodes (LEDs) and to a method of making such an assembly.

2. Description of the Relate Art Including Information Disclosed Under 37 CFR 1.97 and 1.98

Conventional LED assemblies include one or more LEDs in a plastic body that protects the LED and its lead wires. For example, FIG. 1 (disclosed in U.S. Pat. No. 6,345,903) illustrates a conventional assembly 10 in which an LED 12 is carried in reflective frame 14 that is filled with a first resin 16. A wire lead 18 extends from a first LED terminal to a first electrode 20 and a second LED terminal at the base of LED 12 is attached to a second electrode 22. A second resin 24 covers LED 12, frame 14, and wire lead 18, and a lens cap 26 is placed on top of second resin 24. This conventional LED assembly is relatively simple to assemble because the LEDs are encapsulated.

Unfortunately, the protective enclosure also captures the heat generated by the LED. As is known, heat is significant factor in LED life and performance; too much heat degrades both.

A known solution to this problem is to place the LED directly on a heat sink. The heat sink can have a convenient shape enabling so that LEDs can be mounted on three-dimensional structures and oriented in desired directions. This arrangement is known as a "chip on board" or an open mount. This arrangement also has problems because the LEDs are quite small and difficult to hold and mount on the heat sink.

Further, as is known, LED assemblies may include a group of LEDs that together provide the required number of lumens. The "chip on board" arrangement is difficult to use with groups of LEDs because the LEDs must be close to each other and mounting such LEDs is particularly difficult. The arrangement shown in FIG. 1 is also cumbersome with groups of LEDs because the size of the reflective frames may prevent proper placement.

BRIEF SUMMARY OF THE INVENTION

An object of the present invention is to provide a novel LED assembly and method that avoids the problems of the prior art.

A further object of the present invention is to provide a novel LED assembly and method that uses a template to facilitate placement of plural LEDs directly on a heat sink, thereby providing both the thermal control advantages of a "chip on board" and the ease of placement of encapsulated LEDs.

A yet further object of the present invention is to provide a novel LED assembly and a method of making the assembly, in which a template is provided with a two sets of holes, a heat sink is attached to the template beneath the first set of holes and an electrically conductive sheet is attached to the template beneath the second set of holes, and in which LEDs are placed in the first set of holes so that each has a first LED terminal on and adhered to an exposed part of the heat sink and a second LED terminal is connected via a wire lead to the sheet through a respective one of the second holes.

These and other objects and advantages of the invention will be apparent to those of skill in the art of the present invention after consideration of the following drawings and description of preferred embodiments.

DETAILED DESCRIPTION OF THE INVENTION

Figure 1:
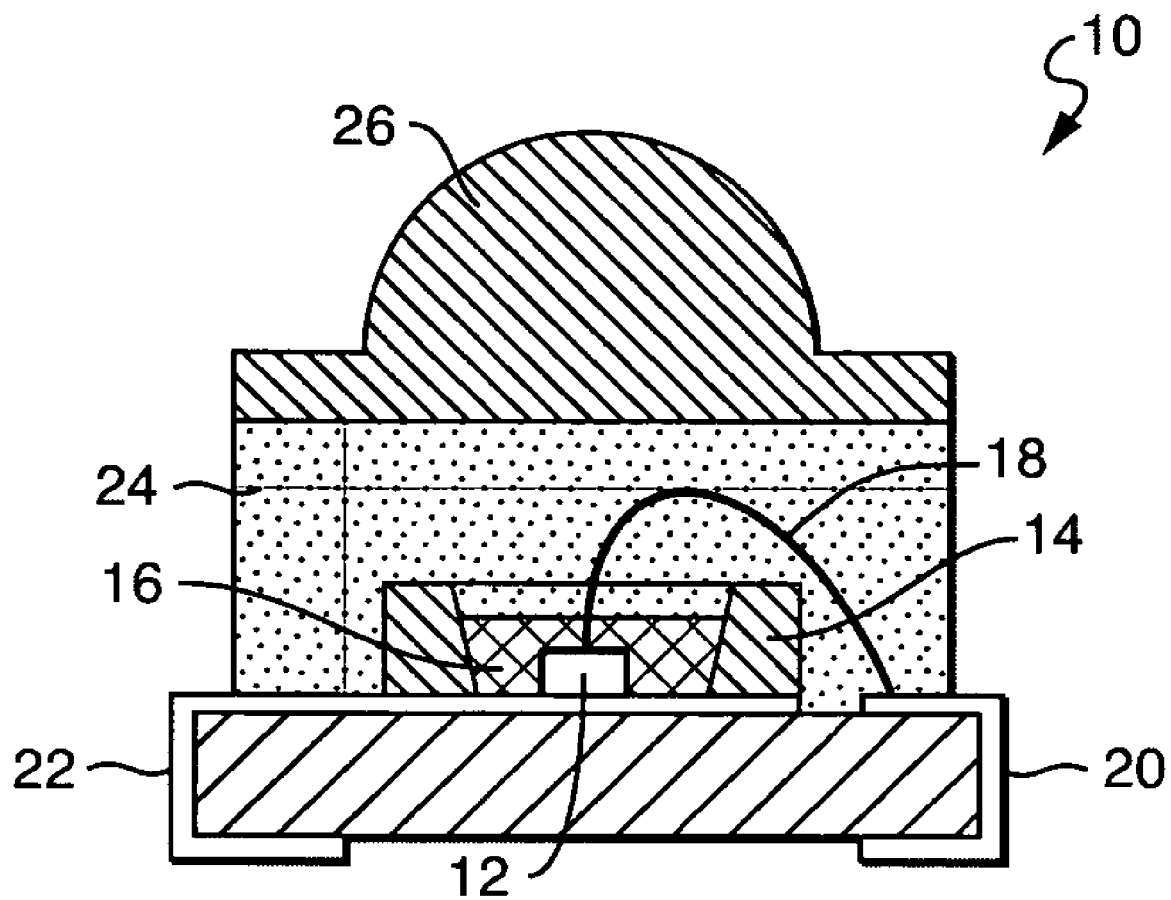
FIG. 1 a cross section of an LED assembly of the prior art.
Figure 2:
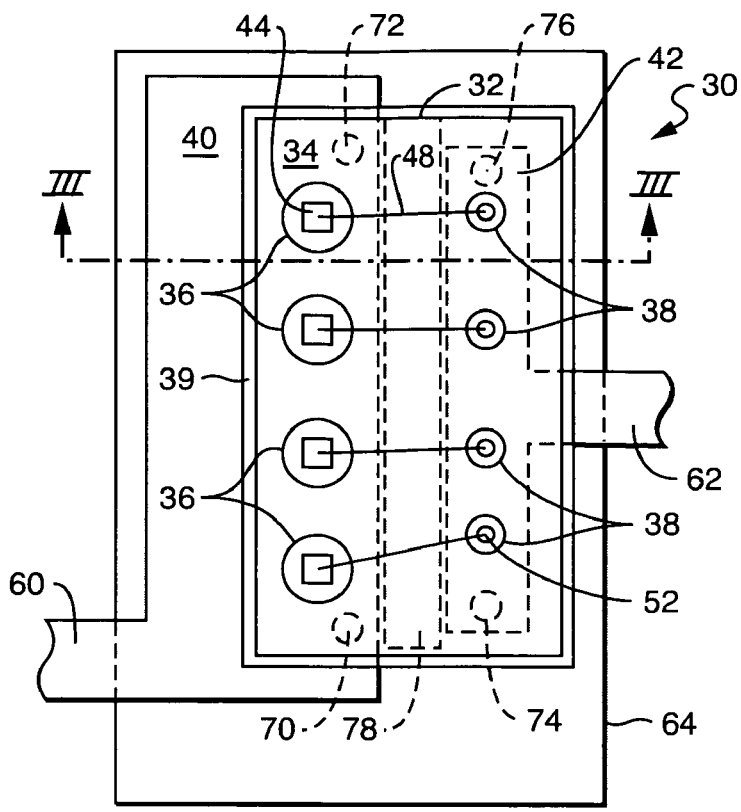
FIG. 2 is a top plan view of an embodiment of the LED assembly of the present invention.
Figure 3:
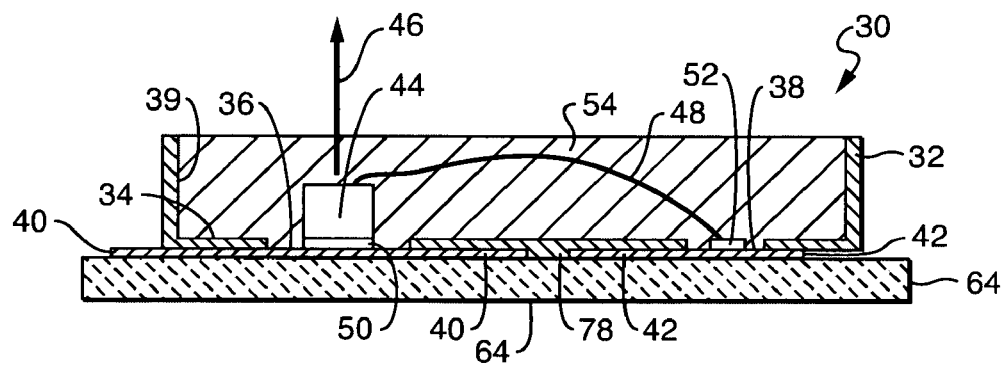
FIG. 3 is a cross section of section III-III of FIG. 2.

With reference to FIGS. 2 and 3, a preferred embodiment of an LED assembly 30 includes a walled container 32, a first conductor 40, a second conductor 42, one or more LED dies 44, a lead wire 48 and an encapsulant 54. An additional supportive or heat sinking substrate 64 may also be included.

The preferred walled container 32 has an open top through which light is emitted, sidewalls 39, and a bottom 34, all arranged to define a surrounded volume that may be filled with an encapsulant 54. In the preferred embodiment the container 32 is formed from a white, reflective molded plastic. Sidewalls 39 may have reflective surfaces to aid in the useful collection and reflection of light emitted from the sides of the LED die 44. The side walls 39 may have the form of a surface of revolution around LED dies 44, or segmented subsections centered respectively on particular LED dies 44 or may be rectangular as shown to parallel side edges of the LED dies 44. The bottom 34 is formed with a first set of holes 36 and a second set of holes 38. In the preferred embodiment, the container 32 is molded with a bottom 34 having one or more attachment features to mate with and hold the container 32 to the first connector 40 and the second connector 42. As shown, the attachment features may be four downward projecting pins 70, 72, 74, 76 designed to mate in corresponding holes formed through the first connector 40 and the second connector 42. Alternatively or in combination, the bottom 34 may be formed with walled sections that define conformal recesses that help position and retain the first connector 40 and the second connector 42. The attachment features then serve to locate and hold the container 32 in position relative to the first conductor 40, and second conductor 42.

First conductor 40 and second conductor 42 provide the two ends of the electric circuit to power the LED dies 44. It is convenient that the first conductor 40 and the second conductor 42 be planar sheets with squared edges that may be conformably fit into crevices formed on the bottom side of the container 32, or formed with openings to received formed projections from the container 32. It should be noted that in the planar sheet format, first conductor 40 and second conductor 42 can be conveniently cut from a large sheet or spool with any excess material trimmed at a later time. It is however understood that the first conductor 40 and the second conductor 42 need not be strictly planar. The first conductor 40, and second conductor 42 may include ribs, holes, curves, snaps or spring features or have other convenient shapes or projections to enable coupling to the container 32, to an additional substrate 64 or to enhance heat conduction from the LED dies 44. The container 32 and first conductor 40, and second conductor 42 are preferably heat staked together, for example by four downward projecting pins 70, 72, 74, 76 mated in holes formed through first conductor 40 and second conductor 42.

As shown container 32 includes on its bottom surface a ridge 78 or similar wall or walls to conformably mate with the sides of first conductor 40, and second conductor 42. The ridge 78 fills the region between the side edges of the first conductor 40, and second conductor 42. The container 32 is then mechanically braced against the first conductor 40, and second conductor 42, providing additional strength to the assembly. The ridge 78 also serves to prevent encapsulant 54 from leaking though first set of holes 36, and second set of holes 38 into any open region between the first conductor 40, and second conductor 42.

The first conductor 40 and second conductor 42 may also provide heat sinking for the LED dies 44, or heat conduction from the assembly at large. It is particularly useful that first conductor 40 provide heat sinking for the attached LED dies 44. A relatively massive or thermally highly conductive first conductor 40 is preferred. In the preferred embodiment the first conductor 40 is formed with one or more mounting pads 50 on which the LED dies 44 may be mounted. The mounting pad or pads 50 are aligned to support the LED dies 44 in the first set of holes 36. Similarly, the second conductor 42 may be formed with one or more mounting pads 52 aligned to receive and be bonded with the wire leads 48 extending from the LED dies 44. The electric circuit then extends from the first conductor 40 through pad 50 to an LED die 44, and then to a wire lead 48, the second pad 52 and the second conductor 42. The pad 52 on second conductor 42 may not be needed. The requirement of pad 52 depends on what is necessary for making a proper bond between the wire leads 48 and the second conductor 42.

First conductor 40 may take any suitable shape and size and may extend beyond a periphery of container 32 on one or more sides. A connector 60 to a further heat sink or to a power source may be provided (not shown). Similarly, the second conductor 42 may include a connector 62 for connection to a power source or other thermally or electrically conductive elements. The size and shape of the first conductor 40 and the second conductor 42 should be sufficient to underlie the respective first set of holes 36 and second set of holes 38.

Each of the holes in first set of holes 36 has an LED die 44 aligned therein that emits light, such as illustrated by arrow 46. Each LED die 44 has a base, which is a first LED terminal, which is place on and attached to an exposed part of first conductor 40 through the respective one of the holes in first set of holes 36, and a second LED terminal connected via a wire lead 48 to second conductor 42 through a respective one of the second set of holes 38. LED dies 44 may be attached to first conductor 40 with an electrically conductive adhesive forming pad 50 or other suitable material.

A substrate 64 may also be added as support for assembly 30, and can have a suitable thickness and area. Substrate 64 is usually a base support layer for the LED assembly, for example a formed metal body acting as a heat sink and as a mechanical support to hold and orient the LED assembly in a preferred direction. Substrate 64 is then usually substantially larger than the LED assembly 30. Electrically insulative spacers 66 may be provided between the first conductor 40 and second conductor 42 to further facilitate manufacture and to assure separation of these parts.

Covering the LED dies 44 and the lead wire 48 is a clear encapsulant. The encapsulant 54 may be any of those known in the art. For example the encapsulant 54 may be a clear gel that easily flexes with thermal changes so that wire leads 48 are not damaged during thermal changes.

The LED assembly 30 is particularly convenient to construct. The various pieces are first individually constructed. The container 32 is preferably molded. The first conductor 40 is formed with the first pad(s) 50. The second conductor 42 is similarly formed with the second pad(s) 52, if any is required. The LED dies 44 may be first attached to the conductor 44 on the pad(s) 50. The plastic container 32 including any conforming bottom walls or pins is then aligned over the first conductor 40 and the LED dies 44, with the LED dies 44 exposed through the first set of holes 36. The container 32 is a then, using the coupling features formed on the bottom surface, mated to the first conductor 40. For example, aligning bottom walls may receive and be snapped together with the first conductor 40; or using the formed downward projecting pins 70 72, may be inserted in corresponding holes and heat staked to the first conductor 40. The second conductor 42 may be similarly connected. Alternatively, container 32 and first conductor 40, and second conductor 42 may be coupled together first, leaving the mounting pads 50 and 52 exposed through the respective first set of holes 36 and second set of holes 38. The LED dies 44 are subsequently positioned in the first set of holes 36, on the first pad(s) 50 formed on the first conductor 40, using the container 32 as a template to position the LED dies 44. In either case, a wire leads 48 is bonded between the exposed LED die 44 and, via the second set of holes 38 to the second pad(s) 52 or conductor 42 as the case may be. Wire leads 48 may be bonded to bonding pads 52 on second conductor 42 in a respective one of the second set of holes 38.

A method of making an LED assembly 30 includes the steps of forming a walled container 32 that has an open top, with a bottom 34, the bottom being formed with a first set of holes 36 and a second set of holes 38. First conductor 40 is electrically and thermally attached to an exterior bottom surface container 32 beneath adjacent the first set of holes 36 so that portion(s) of the first conductor 40 is(are) exposed in first set of holes 36. The second conductor 42 is similarly attached electrically and thermally conductively to the exterior bottom surface of container 32 beneath second set of holes 38 so that second conductor 42 is exposed in second set of holes 38. The first conductor 40 and second conductor 42 are of coursed spaced apart from each other for electrical purposes. LED dies 44 are guided to and placed on the part of the first conductor 40 exposed in first set of holes 36. The LED dies 44 are then attached to the bases of LED dies 44, which are first LED terminals, to the exposed parts of first conductor 40, attaching second conductor 42 to second terminals of LED dies 44 with respective wire leads 48 that each extend from a respective one of LED dies 44 to second conductor 42 through a respective one of the holes in second set of holes 38, and covering LED dies 44 with a transparent material 54 in container 32.

The encapsulant 54 is then flowed into the container 32, over the LED dies 44 filling the container and covering the lead wire(s) 48. The substrate 64 may be attached during the sequence of assembly as may be convenient. The LED dies 44 and the wire leads 48 may be protected with an encapsulant 54, as is known in the art by sufficiently filling the container 32 to cover the LED dies 44 and the wire leads 48. Further provision can be made to attach a dome over the top of the container 32 to enclose the LED die(s) 44 to increase light extraction as is known in the art.

Using the container 32 as a template makes placement of the LED dies 44 easier, thereby improving the manufacturing cost. Container 32 becomes a template for placement of LED dies 44 and the first set of holes 36, and second set of holes 38 may be formed at positions and in a quantity appropriate for the intended purpose.

Heat transfer from the LED dies and the assembly at large is improved. Since the LED dies 44 are mounted on the heat sinking first conductor 40 through the respective holes 36, and are not on the container material, there are fewer thermally insulating layers between the LED dies 44 and the available heat sink. Heat transfer is then more efficient than in the prior art. Also the heat sinking electrical conductor 40 can be made large thereby enabling a larger heat flow than in the prior art.

Another advantage of the embodiment of FIGS. 2 and 3 is that the overall thickness of assembly 30 may be reduced. The preferred first conductor 40 and second conductor 42 are coplanar with bottom 34, enabling the electrical and thermal conduction to be spread over a thin area, and not through a thick channel. The sidewalls 39 act as guards for the wire leads 48. The wire lead 48 then only needs to be minimally covered by the encapsulant 54 (defined by the side wall height) and not covered by a high dome of a protective encapsulant as might otherwise be required.

Figure 4:
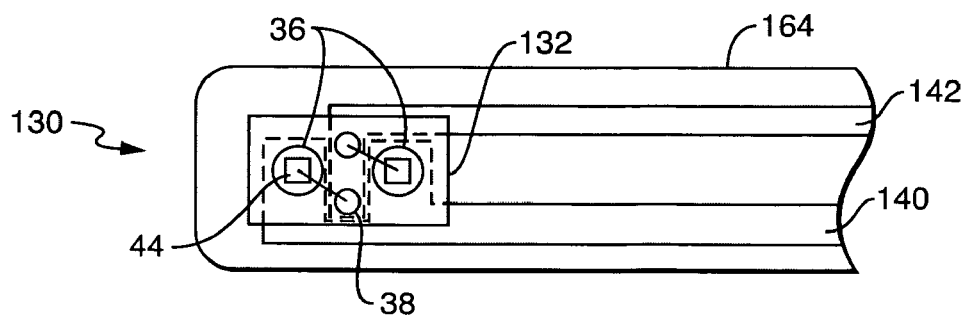
FIG. 4 is a top plan view of a further embodiment of the LED assembly of the present invention.
Figure 5:
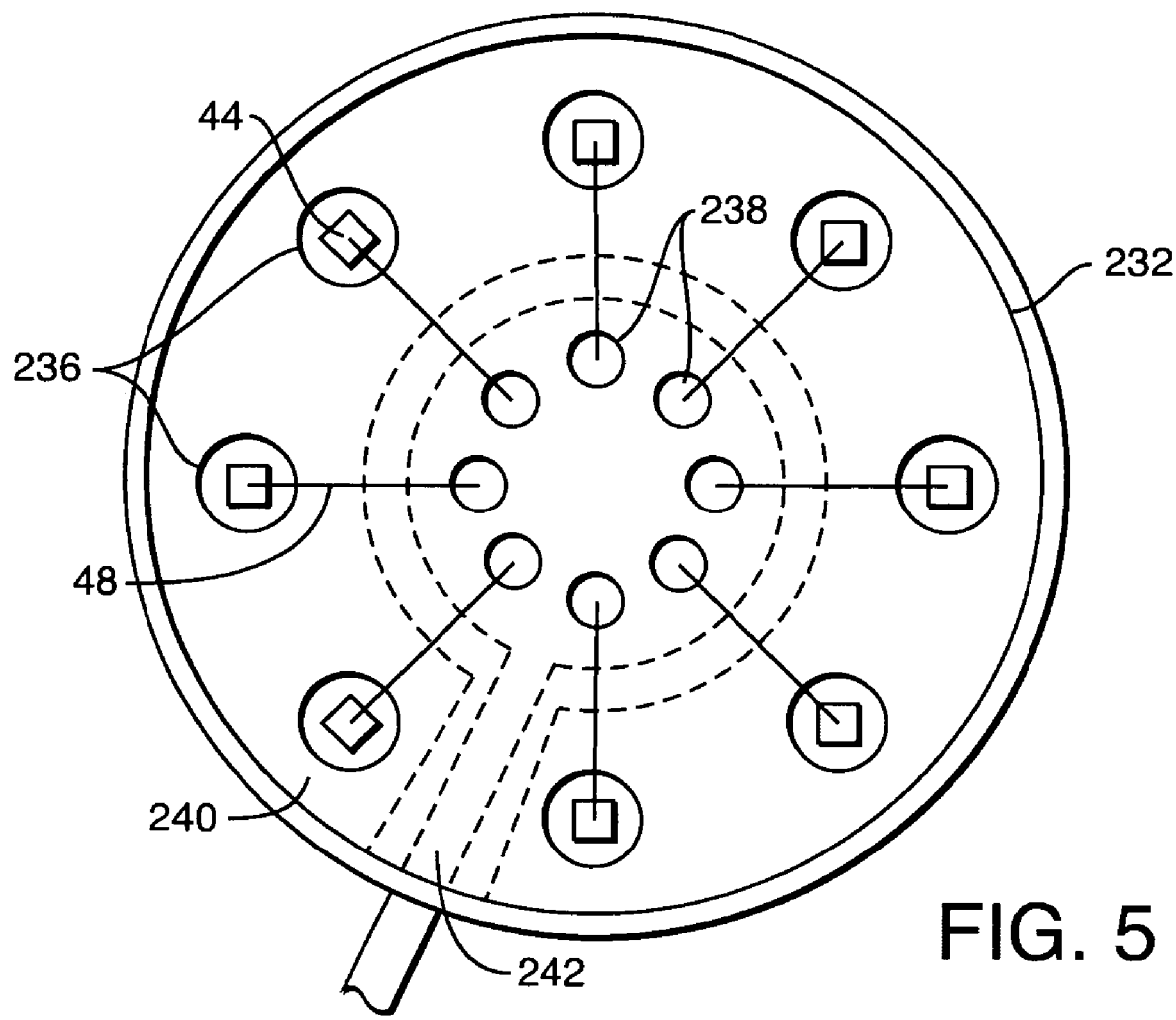
FIG. 5 is a top plan view of yet a further embodiment of the LED assembly of the present invention.
Figure 6:
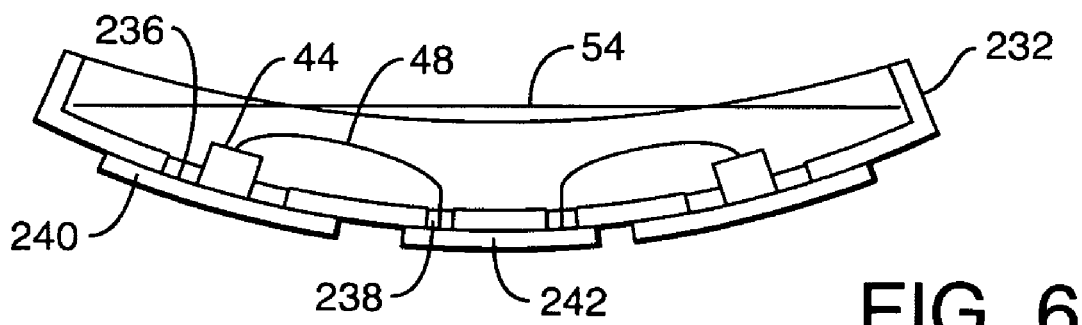
FIG. 6 is a cross section of an embodiment of the LED assembly of FIG. 5.

Other embodiments of the LED assembly of the present invention are also possible. The shape of the assembly need not be rectangular with linearly aligned rows of LED dies, but maybe circular or similarly sculpted for convenient used in a fixture. For example, with reference to FIG. 4, container 132 of LED assembly 130 may be placed at one end of an elongated substrate 164 across which are extended heat sink 140 and sheet 142. Further, other arrangements of the sets of holes are available, such as illustrated in FIG. 5 that includes a round container 232, annular heat sink 240 and sheet 242 and concentric rings of first set of holes 236 and second set of holes 238. The assembly need not be flat, as shown in FIG. 6. Other arrangements and shapes falling within the limitations herein claimed are also possible.

While embodiments of the present invention have been described in the foregoing specification and drawings, it is to be understood that the present invention is defined by the following claims when read in light of the specification, and drawings.

What is claim is:

1. A light emitting diode (LED) assembly, comprising:
a walled container having an open top and a bottom, said bottom formed with a first set of plural holes and a second set of plural holes there through;
a first electrically and thermally conductive conductor attached to an exterior surface of said bottom beneath said first set of holes and that is exposed in said first set of holes;
a second electrically conductive conductor attached to the exterior surface of said bottom beneath said second set of holes and that is exposed in said second set of holes, said first electrically conductive conductor and second electrically conductive conductor being spaced apart from each other;
plurality of LEDs that are each in a different one of the holes in said first set of holes and that each have a base, which is a first LED terminal, on and attached to an exposed part of said first conductor through the respective one of the holes in said first set of holes and a second LED terminal connected via a wire lead to said second conductor through a respective one of the holes in said second set of holes; and
a transparent material in said container covering said LEDs.

2. The assembly of claim 1, wherein said first conductor and second conductor are coplanar.

3. The assembly of claim 1, wherein said transparent material fills said container and covers said first set of holes and said second set of holes and said wire lead.

4. The assembly of claim 1, wherein said bottom of said container is planar.

5. The assembly of claim 1, wherein said first conductor extends beyond a periphery of said container on three sides of said container.

6. The assembly of claim 1, further comprising a generally planar substrate supporting both said first conductor and second conductor.

7. The assembly of claim 1, wherein said container is plastic and reflects light from said LEDs.

8. The assembly of claim 1, further comprising an electrically conductive adhesive attaching said LEDs to said first conductor.

9. The assembly of claim 1, further including bonding pads formed on said second conductor and exposed in said second set of holes, each said wire lead being bonded to a respective one of said pads exposed in a respective one of said second set of holes.

10. A method of making a light emitting diode (LED) assembly, comprising the steps of:
forming a first set of holes and a second set of holes through a bottom of a walled container having an open top;
attaching a first electrically and thermally conductive conductor to an exterior surface of the bottom beneath the first set of holes so that the first conductor is exposed in the first set of holes;
attaching a second electrically conductive conductor to the exterior surface of the bottom beneath the second set of holes so that the second conductor is exposed in the second set of holes, the first and second conductors being spaced apart from each other;
placing each of plural LEDs on an exposed part of the first conductor in a different hole of the first set of holes and attaching a base thereof, which is a first LED terminal, to the exposed part of the first conductor;
attaching the second conductor to second terminals of the LEDs with respective wire leads that each extend from a respective one of the LEDs to the second conductor through a respective one of the holes in the second set of holes; and
covering the LEDs with a transparent material in the container.

11. The method of claim 10, wherein the transparent material also covers the first and second holes and the wire lead during the covering step.

12. The method of claim 10, further comprising the step of attaching a generally planar supporting substrate to both the first and second conductors.

13. The method of claim 10, wherein the LEDs are attached to the first conductor with an electrically conductive adhesive.

14. The method of claim 10, further comprising the steps of attaching bonding pads to parts of the second conductor exposed in the holes in the second set of holes and bonding each of the wire leads to a respective one of the pads.

15. A light emitting diode (LED) assembly, comprising:
a container with light reflective interior walls and having an open top and a bottom with a first set and a second set of plural holes there through;
an electrically conductive heat sink attached to an exterior surface of said bottom beneath said first set of holes and that is exposed in said first set of holes;

an electrically conductive conductor attached to the exterior surface of said bottom beneath said second set of holes and that is exposed in said second set of holes, said heat sink and said conductor being electrically isolated from each other;

plurality LEDs that are each in a different one of the holes in said first set of holes and that each have a generally flat base, which is a first LED terminal, on and adhered to an exposed generally flat part of said heat sink through the respective one of the holes in said first set of holes and a second LED terminal connected via a wire lead to said conductor through a respective one of the holes in said second set of holes; and a transparent material in said container covering said LEDs, said wire lead, and said first and second sets of holes.

16. The assembly of claim 15, wherein said transparent material fills said container.

17. The assembly of claim 16, wherein said heat sink extends beyond a periphery of said container on three sides of said container.

18. The assembly of claim 15, further comprising an electrically conductive adhesive attaching said LEDs to said heat sink.

19. The assembly of claim 15, further comprising bonding pads in the holes in said second set of holes, each said wire lead being bonded to a respective one of said pads.

* * * * *